US009269289B2

(12) United States Patent
Gao et al.

(10) Patent No.: US 9,269,289 B2
(45) Date of Patent: Feb. 23, 2016

(54) SHIFT REGISTER UNIT, GATE DRIVING CIRCUIT AND DISPLAY APPARATUS

(71) Applicants:BOE Technology Group Co., Ltd., Beijing (CN); Chengdu BOE Optoelectronics Technology Co., Ltd., Chengdu (CN)

(72) Inventors: Shan Gao, Beijing (CN); Weiyun Huang, Beijing (CN); Xiaojing Qi, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 192 days.

(21) Appl. No.: 14/023,728

(22) Filed: Sep. 11, 2013

(65) Prior Publication Data

US 2014/0071104 A1    Mar. 13, 2014

(30) Foreign Application Priority Data

Sep. 13, 2012  (CN) .......................... 2012 1 0337970

(51) Int. Cl.
*G09G 3/00* (2006.01)
*G09G 3/36* (2006.01)
*G11C 19/28* (2006.01)

(52) U.S. Cl.
CPC .............. *G09G 3/007* (2013.01); *G09G 3/3674* (2013.01); *G11C 19/28* (2013.01); *G09G 2310/0286* (2013.01); *G09G 2320/0219* (2013.01)

(58) Field of Classification Search
CPC .......... G09G 3/007; G09G 2320/0219; G09G 3/3674; G09G 2320/0286; G11C 19/28

USPC .......... 345/208, 87, 99, 100, 211; 377/54, 75, 377/79
See application file for complete search history.

(56) References Cited

U.S. PATENT DOCUMENTS 6,300,928 B1 * 10/2001 Kim ..................... G06G 3/3677
                                                345/100
6,339,631 B1 *  1/2002 Yeo ........................ G11C 19/28
                                                 377/64

(Continued)

FOREIGN PATENT DOCUMENTS

CN        101978504 A        2/2011

OTHER PUBLICATIONS

Extended European search report issued by the European Patent Office on Jan. 3, 2014 for application No. 13183967.2, 9 pages.

(Continued)

*Primary Examiner* — Temesgh Ghebretinsae
*Assistant Examiner* — Benyam Ketema
(74) *Attorney, Agent, or Firm* — Banner & Witcoff, Ltd.

(57) ABSTRACT

A shift register unit, a gate driving circuit and a display apparatus are disclosed. The shift register unit includes a first TFT (T1) having a first electrode connected to an input terminal and a gate connected to a second clock signal input terminal; a second TFT (T2); a third TFT (T3) having a second electrode connected to an output terminal, a first electrode connected to a first clock signal input terminal, and a gate connected to the second electrode of the first TFT; a fourth TFT (T4); a fifth TFT (T5) having a gate connected to the second clock signal input terminal, a first electrode connected to the output terminal and a second electrode connected to the low potential connecting terminal; a capacitor (C1), and thus the burrs and miscellaneous spikes in a gate driving waveform outputted by the circuit can be suppressed well.

6 Claims, 5 Drawing Sheets

(56) References Cited

U.S. PATENT DOCUMENTS

| | | | | |
|---|---|---|---|---|
| 6,778,627 B2* | 8/2004 | Yu | G11C 19/184 345/100 | |
| 7,038,653 B2* | 5/2006 | Moon | G09G 3/3677 345/100 | |
| 7,760,846 B2* | 7/2010 | Peng | G11C 19/28 377/64 | |
| 8,019,039 B1* | 9/2011 | Tsai | G11C 19/184 377/64 | |
| 8,054,935 B2* | 11/2011 | Tsai | H03K 19/096 377/64 | |
| 2002/0044625 A1* | 4/2002 | Kim | G11C 19/28 377/54 | |
| 2002/0149318 A1* | 10/2002 | Jeon | G09G 3/3648 315/169.1 | |
| 2006/0269038 A1* | 11/2006 | Jang | G11C 19/287 377/64 | |
| 2006/0291610 A1* | 12/2006 | Lo | G11C 19/28 377/64 | |
| 2007/0079191 A1* | 4/2007 | Shin | G09G 3/325 714/726 | |
| 2007/0296662 A1* | 12/2007 | Lee | G09G 3/3677 345/87 | |
| 2008/0062071 A1* | 3/2008 | Jeong | G11C 19/184 345/46 | |
| 2010/0171689 A1* | 7/2010 | Jeong | G11C 19/18 345/100 | |
| 2010/0207667 A1* | 8/2010 | Kwon et al. | 327/108 | |
| 2010/0289992 A1 | 11/2010 | Nojiri et al. | | |
| 2011/0007049 A1* | 1/2011 | Kikuchi et al. | 345/208 | |
| 2012/0129962 A1* | 5/2012 | Ellsworth et al. | 521/85 | |
| 2012/0139962 A1* | 6/2012 | Chung | G09G 3/3266 345/690 | |
| 2013/0120326 A1* | 5/2013 | Chung et al. | 345/204 | |

OTHER PUBLICATIONS

First Office Action (Chinese language) issued by the State Intellectual Property Office ("SIPO") on Jul. 30, 2014 for application No. CN201210337970.1, 6 pages.

English translation of first Office Action issued by SIPO on Jul. 30, 2014 for application No. CN 201210337970.1 (listed above), 5 pages.

English abstract of CN 101978504(A), listed above, 1 page.

Second Office Action (Chinese language) issued by the State Intellectual Property Office ("SIPO") on Sep. 29, 2014 for application No. CN201210337970.1, 3 pages.

English translation of second Office Action issued by SIPO on Sep. 29, 2014 for application No. CN 201210337970.1 (listed above), 4 pages.

Apr. 23, 2015—(CN)—Reexamination Notification of Appn 201210337970.1 with Eng Tran.

* cited by examiner

SHIFT REGISTER UNIT, GATE DRIVING CIRCUIT AND DISPLAY APPARATUS

CROSS REFERENCE TO RELATED APPLICATIONS

This application claims priority from Chinese National Application No. 201210337970.1 filed on Sep. 13, 2012, the contents of which are incorporated herein by reference.

TECHNICAL FIELD OF THE DISCLOSURE

The present disclosure relates to a field of liquid crystal display screen manufacturing, and particularly to a shift register unit, a gate driving circuit and a display apparatus.

BACKGROUND

At present, display screens of more and more mobile phones have a structure with a narrow frame. A primary technique for accomplishing a narrow frame for Thin Film Transistor-Liquid Crystal Display (TFT-LCD) in a display screen is a gate driving technique, which achieves the purpose of making TFT-LCD of the display screen have the narrow fame by a manner of omitting gate fan-out. As compared to other techniques, such gate driving technique does not require introducing a new optical mask or adding any additional process, and thus it is fully compatible with existing manufacturing process of TFT-LCD. In addition, cost for manufacturing the gate driving circuit is low and reliability is high. Due to the above reasons, the gate driving technique has become the primary technique for accomplishing the narrow frame for TFT-LCD at present.

The existing gate driving circuit mainly includes shift register units and an inverter having functions of pulling up an electrical potential (that is, increasing the electrical potential of an output terminal) and pulling down the electrical potential (that is, decreasing the electrical potential of the output terminal). The basic operational principle of the existing gate driving circuit is as follows: inputting a square wave having a certain width by inputting Integrated Circuit (IC) signal, scanning pixels in each of rows from up to down, and representing output voltages of pixels of the scanned row in a square wave. The operational principle of an existing shift register unit circuit is as shown in FIG. 1. Since a clock signal CLK1 in such shift register unit circuit is in series connected to a capacitor C1 having a big capacitance, power consumption of the circuit will be increased. In addition, an output terminal Row(n) is in a floating state most of the time with the electrical potential thereof not being pulled down, there are many burrs and miscellaneous spikes in the waveform of the output voltage of the output terminal Row(n), thus quality of display being reduced.

SUMMARY

Embodiments of the present disclosure provide a display apparatus based on a gate driving circuit for suppressing burrs and miscellaneous spikes in a gate driving waveform outputted by the circuit to increase quality of display, meanwhile reducing the space for layout of the circuit, and reducing power consumption of the circuit.

Embodiments of the present disclosure provide a shift register unit including an input terminal, an output terminal, a first clock signal input terminal, a second clock signal input terminal, a low potential connecting terminal and a reset terminal, wherein the shift register unit further includes a first Thin Film Transistor (TFT) having a first electrode connected to the input terminal and a gate connected to the second clock signal input terminal; a third TFT having a second electrode connected to the output terminal, a first electrode connected to the first clock signal input terminal, and a gate connected to a second electrode of the first TFT; a second TFT having a first electrode connected to the second electrode of the first TFT, a gate connected to the reset terminal, and a second electrode connected to the low potential connecting terminal; a fourth TFT having a first electrode connected to the output terminal, a gate connected to the reset terminal, and a second electrode connected to the low potential connecting terminal; a fifth TFT having a gate connected to the second clock signal input terminal, a first electrode connected to the output terminal, and a second electrode connected to the low potential connecting terminal; a capacitor connected between the gate and the second electrode of the third TFT; wherein a first clock signal input from the first clock signal input terminal and a second clock signal input from the second clock signal input terminal have a same period and are inverted to each other.

According to an embodiment, in the first TFT, the second TFT, the third TFT, the fourth TFT and the fifth TFT, the first electrode of any of t TFTs is drain and the second electrode thereof is source, and the first electrode of any of (54) TFTs is source and the second electrode thereof is drain, wherein t is an integer and $0 \leq t \leq 5$.

According to an embodiment, all of the first TFT, the second TFT, the third TFT, the fourth TFT and the fifth TFT are N type Transistors.

According to an embodiment, polycrystalline silicon, amorphous silicon or oxide semiconductors are used as material of semiconductor layer in the TFTs.

Embodiments of the present disclosure further provide a gate driving circuit including n above-described shift register units, wherein the input terminal of a first shift register unit is connected to a start signal input terminal; the input terminal of an $m^{th}$ shift register unit is connected to the output terminal of an $(m-1)^{th}$ shift register unit, the reset terminal of the $m^{th}$ shift register unit is connected to the output terminal of an $(m+1)^{th}$ shift register unit, wherein both m and n are integers and $1<m<n$.

Embodiments of the present disclosure further provide a display apparatus including the above-described gate driving circuit.

The embodiments of the present disclosure provide a gate driving circuit including n shift register units, each of the shift register units only adopts 5 TFTs and one capacitor and has a simple structure, which can effectively reduce the area for layout of the circuit and also reduce power consumption of the circuit. In addition, by means of the structure wherein the gate of the first TFT is connected to the second clock signal input terminal, the first electrode of the first TFT is connected to the input terminal, the second electrode of the first TFT is connected to the capacitor, the gate of the third TFT and the first electrode of the second TFT, the electrical potential of the output terminal is increased, and with the aid of the fifth TFT connected between the output terminal and the low potential and controlled by the second clock signal, the electrical potential of the output terminal is pulled down, and thus it is capable of suppressing burrs and miscellaneous spikes in the gate driving square wave outputted by the circuit better.

BRIEF DESCRIPTION OF THE DRAWINGS

In order to explain the technical solutions in the embodiments of the present disclosure or in the prior art more clearly, accompanying drawings required for describing the embodiments of the present disclosure or the prior art will be introduced. Obviously, the accompanying drawings below are only some embodiments of the present disclosure, and based on the accompanying drawings, other accompanying drawings can be obtained by those skilled in the art without paying any inventive labor.

DETAILED DESCRIPTION

Descriptions will be made clearly and thoroughly for the technical solutions in the embodiments of the present disclosure below, taken in conjunction with the accompanying drawings of the embodiments of the present disclosure. Obviously, the described embodiments are only some but not all of the embodiments of the present disclosure. Other embodiments obtained by those skilled in the art based on the described embodiments without paying any inventive labor shall belong to the scope sought for protection in the present disclosure.

In embodiments of the present disclosure, a gate driving circuit is proposed, wherein a shift register unit in the gate driving circuit has a relatively smaller number of TFTs and has a simple structure, so that the space for layout of the circuit can be reduced. As compared to the prior art, in the embodiments of the present disclosure, there is no serial capacitor, and there is only a capacitor functioning as pulling up an electrical potential of a gate of a third TFT, so power consumption of the circuit is small. With the aid of a fifth TFT connected between an output terminal and a low potential, controlled by a second clock signal, an electrical potential of an output terminal is pulled down, so burrs and miscellaneous spikes in the gate driving square wave outputted by the circuit may be well suppressed.

Preferred embodiments of the present disclosure will be described below with reference to the accompanying drawings.

The shift register unit in the gate driving circuit proposed in the embodiments of the present disclosure includes an input terminal Start, a reset terminal Reset, an output terminal Output, a first Thin Film Transistor (TFT) T1, a second Thin Film Transistor T2, an electrical potential pulling up portion (including a third TFT T3), an electrical potential pulling down portion (including a fourth TFT T4 and a fifth TFT T5). A connection point of a gate of T3 and a capacitor C1 in FIG. 2 is called as a point Q.

Since a better display effect can be obtained adopting N type transistors in actual applications, TFTs in the gate driving circuit based on n shift register units provided in the preferred embodiments of the present disclosure are all N type transistors.

Figure 1:
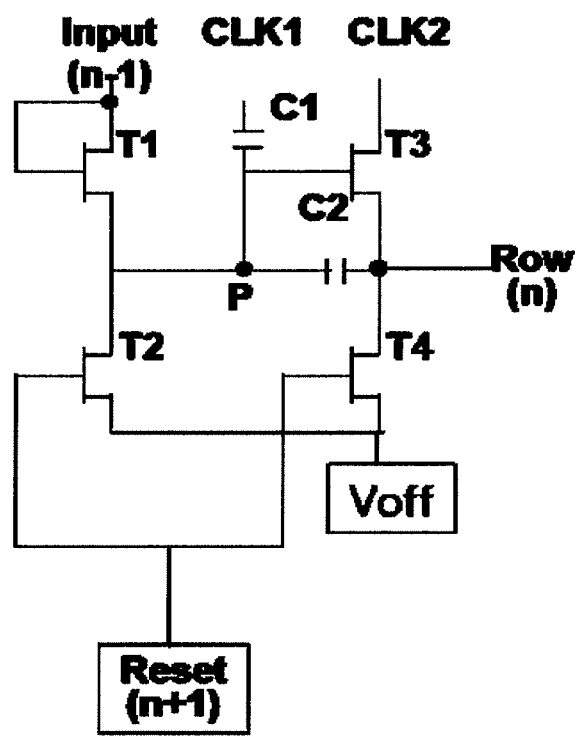
FIG. 1 is a schematic structure diagram of a shift register unit circuit in a basic gate driving circuit in the prior art.
Figure 2:
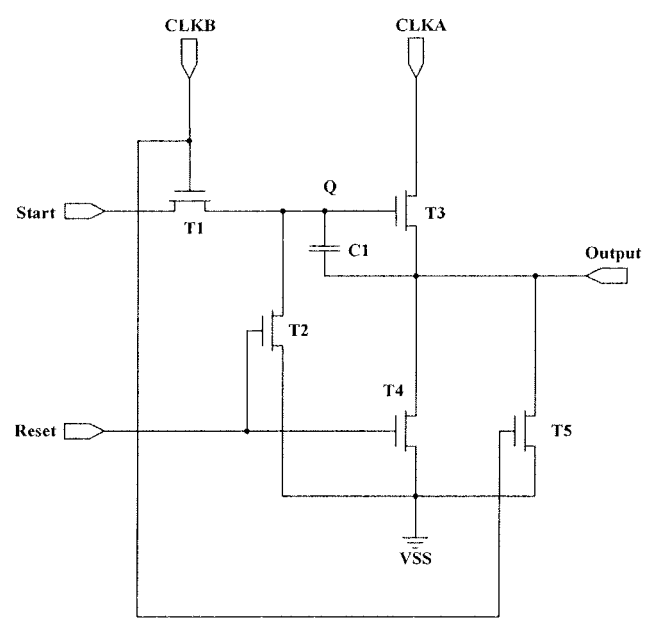
FIG. 2 is a schematic structure diagram of a shift register unit circuit in a basic gate driving circuit in embodiments of the present disclosure.

The shift register unit in the gate driving circuit proposed in the embodiments of the present disclosure is as shown in FIG. 2, and particularly includes:

the input terminal Start connected to the first electrode of T1, for inputting a voltage having a high level during a half clock signal period when scanning is started and thereafter constantly inputting a voltage having a low level;

the reset terminal Reset connected to gates of T2 and T4;

the output terminal Output connected to a first electrode of T5, a first electrode of T4, a second electrode of T3 and one terminal of the capacitor C1;

the capacitor C1 with the one terminal connected to the output terminal, the second electrode of T3, the first electrode of T4 and the first electrode of T5, and the other terminal connected to a second electrode of T1, a first electrode of T2 and a gate of T3;

a first clock signal input terminal CLKA connected to the first electrode of T3;

a second clock signal input terminal CLKB connected to a gate of T1 and a gate of T5;

the first TFT T1 having the gate connected to CLKB and the gate of T5, the first electrode connected to the input terminal Start, and the second electrode connected to the first electrode of T2, the gate of T3 and the other terminal of C1;

the second TFT T2 having the first electrode connected to the second electrode of T1 and a second electrode connected to a low potential connecting terminal Vss;

the third TFT T3 having a first electrode connected to CLKA and the second electrode connected to the first electrode of T4;

the fourth TFT T4 having the gate connected to the gate of T2 and the reset terminal Reset, and the first electrode connected to the second electrode of T3;

the fifth TFT T5 having the gate connected to the second clock signal input terminal CLKB and the gate of T1;

the low potential connecting terminal Vss connected to the second electrode of T2, the second electrode of T4 and the second electrode of T5.

The above-described shift register unit operates under a situation where the two clocks CLKA and CLKB are differential input signals in a single period, that is, the first clock signal and the second clock signal have a same period and are inverted to each other.

In the above-described 5 TFTs, the first electrode of any of t TFTs is drain and the second electrode thereof is source, and the first electrode of any of (5-t) TFTs is source and the second electrode thereof is drain, wherein t is an integer and $0 \leq t \leq 5$.

Those skilled in the art should understand that the connection relationship of the sources/drains of TFTs in the above-described circuit may be properly modified according to the channel type of TFTs. For example, in actual applications, the first electrode of each of the above-described 5 TFTs is drain, and the second electrode is source; alternatively, the first electrode of each of the above-described 5 TFTs is source, and the second electrode is drain.

Based on the above-described shift register unit, the embodiments of the present disclosure provide a gate driving circuit including n above-described shift register units, wherein the first clock signal input terminal and the second clock signal input terminal of two adjacent shift register units are connected to a first common clock signal input terminal and a second common clock signal input terminal alternately, and the low potential connecting terminals of the two adjacent shift register units are connected to a common low potential connecting terminal; the output terminal of each of the shift register units is connected to a corresponding signal output terminal; the input terminal of a first shift register unit is connected to a start signal input terminal; the input terminal of an $m^{th}$ shift register unit is connected to the output terminal of an $(m-1)^{th}$ shift register unit, the reset terminal of the $m^{th}$ shift register unit is connected to the output terminal of an $(m+1)^{th}$ shift register unit, wherein both m and n are integers and $1<m<n$.

Based on the above-described gate driving circuit, the embodiments of the present disclosure further provide a Thin Film Transistor-Liquid Crystal Display (TFT-LCD).

Figure 4:
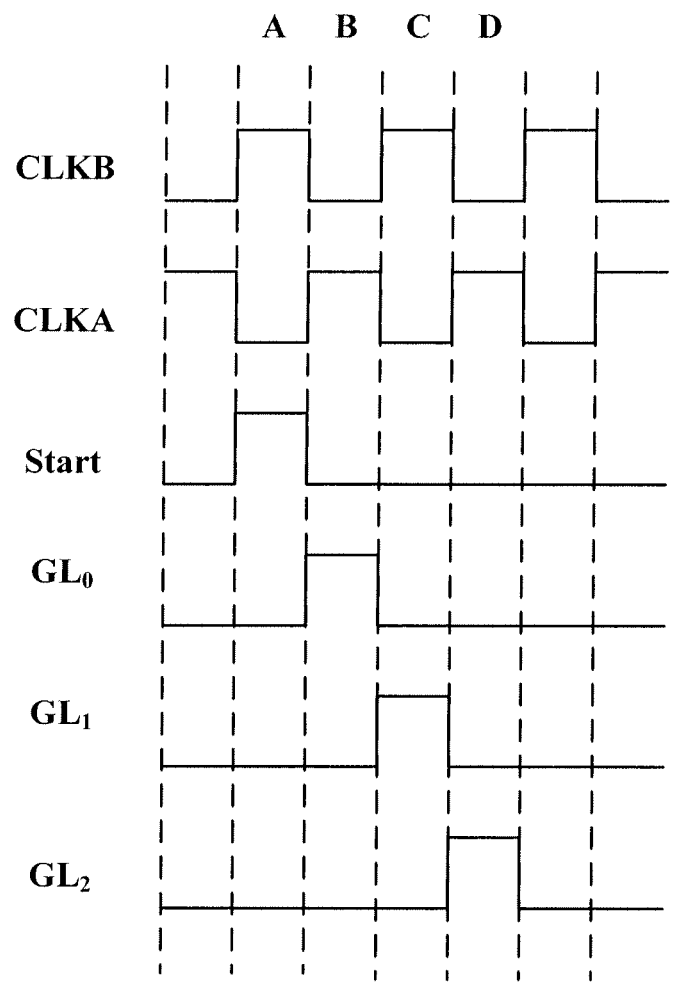
FIG. 4 is a timing sequence waveform for the gate driving circuit performing scanning from up to down in embodiments of the present disclosure.

Based on the above-described shift register unit and the gate driving circuit, the embodiments of the present disclosure provide a method for applying the gate driving circuit, wherein the timing sequence waveform for the gate driving circuit when a scanning is performed from up to down is as shown in FIG. 4, and includes: in a first half period A of a first clock period, inputting a start signal having a high level from the start signal input terminal to the input terminal of the first shift register unit; after the first half period A of the first clock period, inputting constantly the start signal having a low level from the start signal input terminal to the input terminal of the first shift register unit; in a second half period of each clock period (for example B, D and so on), inputting a clock signal having a high level from the first common clock signal input terminal to the first clock signal input terminal of each of the shift register units, and inputting a clock signal having a low level from the second common clock signal input terminal to the second clock signal input terminal of each of the shift register units, outputting the output signal at the output terminal of the $(m-1)^{th}$ shift register unit to the input terminal of the $m^{th}$ shift register unit; in a first half period of each clock period after the first clock period (for example C), inputting a clock signal having the low level from the first common clock signal input terminal to the first clock signal input terminal of each of the shift register units, and inputting a clock signal having the high level from the second common clock signal input terminal to the second clock signal input terminal of each of the shift register units, outputting the output signal at the output terminal of the $(m+1)^{th}$ shift register unit to the reset terminal of the $m^{th}$ shift register unit; wherein both m and n are integers and $1<m<n$.

Description will be given in detail to the shift register unit provided in the embodiments of the present disclosure with reference to FIG. 2.

When the gate driving circuit begins scanning pixels in each of rows from up to down, the input terminal Start supplies a high level pulse signal lasting a half clock period. In such a half clock period, the CLKA is at a low level, the CLKB is at a high level, T1 and T5 are turned on, the high level inputted from the input terminal Start pre-charges the capacitor C1 through T1; in addition, T3 is turned on, the second electrode of T3 is directly connected to the output terminal Output, the low level of the CLKA is input to the first electrode of T3 and is output from the Output through the second electrode of T3.

After the half clock period, the CLKA is at the high level, and the high level of the CLKA is output via T3 to the output terminal Output, meanwhile the capacitor C1 makes the potential of the gate of T3 be pulled up, so that the T3 can transfer the high level of CLKA better.

The above process is a process for the shift register unit to output one stage gate driving square wave. After the half clock period, T2 is turned on under the control of the reset terminal Reset so that the point Q can be discharged, and T4 is turned on under the control of the Reset so that the output terminal Output is pulled down; T1 is turned on due to the high level of CLKB, and the point Q is discharged since the Start signal is at the low level at this time; meanwhile, T5 is turned on due to the high level of CLKB, such that the output level of the Output is pulled down.

When the gate driving circuit scans from up to down, T1 belongs to a pre-charging portion, T2 and T4 belong to a reset portion. The pre-charging portion pre-charges the C1 connected to the gate of T3 in the half clock period when the CLKB is at the high level, such that the C1 charges the gate of T3 after the half clock period.

The function of the electrical potential pulling up portion is outputting a high level signal for gate driving during the half clock period when the CLKA is at the high level, after the pre-charging, that is, after the signal Start charges the C1 through T1 for the half clock period.

The function of the electrical potential pulling down portion is pulling down alternately the electrical potential at the output terminal Output under the control of the signal CLKB and the signal Reset.

Figure 3:
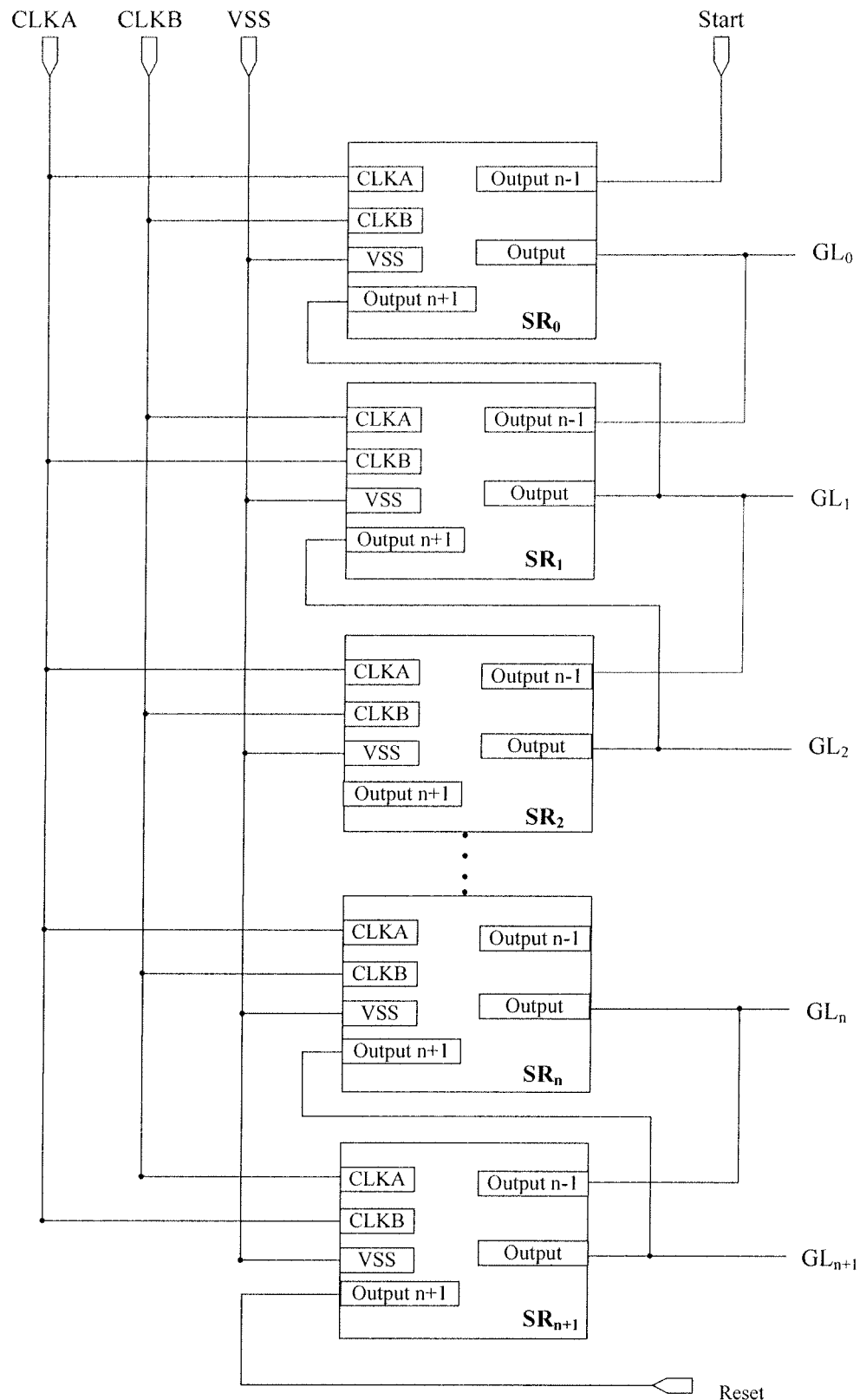
FIG. 3 is a schematic diagram of the gate driving circuit in embodiments of the present disclosure.

FIG. 3 shows the principle diagram of the gate driving circuit of the present disclosure, wherein Output n−1 represents the input terminal of the shift register unit at the current stage and is connected to the output at the previous stage, Output n+1 represents the reset terminal of the shift register unit at the current stage and is connected to the output at the next stage, and Output n−1 of the shift register unit at the first stage of the gate driving circuit is connected to the start signal Start.

FIG. 4 shows the timing sequence waveform for the gate driving circuit when a scanning is performed from up to down in the embodiments of the present disclosure. The Start outputs a high level in a first half period of a first clock period, and then outputs constantly a low level. The CLKA outputs a clock signal having a low level in a first half clock period of each clock period and outputs a clock signal having a high level in a second half clock period of each clock period. The CLKB outputs a clock signal having the high level in the first half clock period of each clock period and outputs a clock signal having the low level in the second half clock period of each clock period. $GL_0$ outputs a clock signal having the high level in the second half clock period of the first clock period, $GL_1$ outputs a clock signal having the high level in a first half clock period of the second clock period, and $GL_2$ outputs a clock signal having the high level in a second half clock period of the second clock period.

Figure 5:
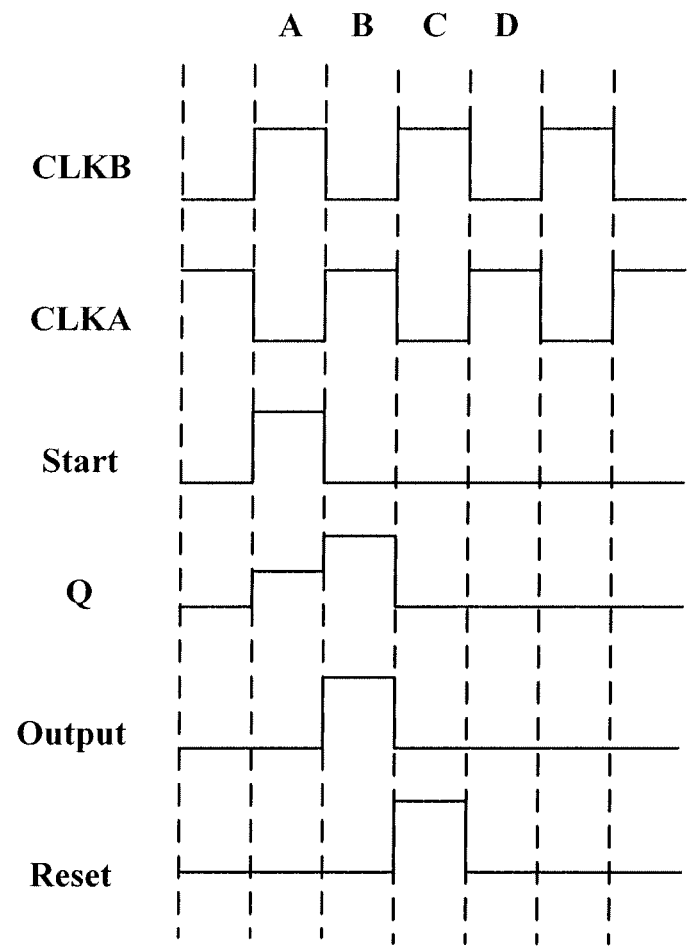
FIG. 5 is a single stage waveform of the gate driving circuit in embodiments of the present disclosure.

FIG. 5 is the single stage waveform of the shift register unit at the first stage in the gate driving circuit of the embodiments of the present disclosure, wherein the output waveforms of CLKA, CLKB and Start are the same as those in FIG. 4. The point Q is in a pre-charging state in the first half clock period of the first clock period, and in a high level state in the second half clock period of the second clock period. The output terminal (Output) outputs a high level in the second half clock period of the first clock period. In the first half clock period of the second clock period, the high level output from the output terminal of the shift register unit at the next stage is input to the Reset.

The operational principle of the gate driving circuit of the present disclosure will be described with reference to the shift register unit circuit of the embodiments of the present disclosure as shown in FIG. 2, the principle diagram of the gate driving circuit of the embodiments of the present disclosure as shown in FIG. 3, the timing sequence diagram for the gate driving circuit performing scanning from up to down of the embodiments of the present disclosure as shown in FIG. 4 and the single stage waveform of the shift register unit at the first stage of the gate driving circuit of the embodiments of the present disclosure as shown in FIG. 5.

A first phase is as shown by A in FIG. 4 and FIG. 5, and is a half clock period in which the gate driving circuit begins to operate, wherein the start signal input from the Start is at a high level, the clock signal of the CLKA is at a low level, and the clock signal of the CLKB is at a high level. The signal Start is input to the input terminal Output n−1 of the first shift register unit $SR_0$, the clock signal having the high level supplied from the CLKB makes T1 be turned on, the signal Start pre-charges the gate Q of the T3 in $SR_0$, so that the voltage at the point Q of T3 is increased. At this time, the reset signal at Output n+1 (that is, Reset) in $SR_0$ is at the low level, both T2 and T4 are in a turned-off state, the point Q of T3 is maintained in a pre-charging state, and the CLKB turns on T5, such that $SR_0$ sets the output signal Output to the low level.

A second phase is as shown by B in FIG. 4 and FIG. 5, and is a half clock period after the first phase, that is, after ending of the pre-charging, wherein the clock signal output from the CLKA is at the high level, the clock signal output from the CLKB is at the low level, and the input signal of the Start is at the low level. At this time, the signal of $GL_1$ is the reset voltage Output n+1 of the first phase and is at the low level, so that T1, T2, T4 and T5 in $SR_0$ are turned off and T3 is turned on, the capacitor C1 makes the electrical potential of the point Q of T3 in $SR_0$ be increased, such that the loss of the high level signal output from the CLKA is tiny in the process of being transmitted through T3. Since $GL_0$ outputs the high level signal in the second phase, the high level signal output from $GL_0$ has been shifted as compared to the start signal Start of $SR_0$. Meanwhile, $GL_0$ inputs the output signal of $SR_0$ to Output n−1 of $SR_1$, the signal Start of $SR_1$ pre-charges the point Q of T3 in $SR_1$ through T1 to make the voltage of the point Q of T3 to be increased.

A third phase is shown by C in FIG. 4 and FIG. 5, and is a half clock period after the second phase. At this time, T3 in $SR_1$ is turned on, the capacitor C1 makes the electrical potential of the point Q of T3 in $SR_1$ be increased, $GL_1$ outputs the high level signal, and the output signal of $GL_1$ has been shifted as compared to the output signal of $GL_0$. As for $SR_0$, the output signal of $GL_1$ is input to Output n+1 of $SR_0$ (that is, Reset of $SR_0$), the input signal of the Start is at the low level, the clock signal output from the CLKA is at the low level, and the clock signal output from the CLKB is at the high level, T1 is turned on; the Start is at the low level and may discharge the point Q of T3 through T1; meanwhile, T5 is turned on by CLKB, and the electrical potential of the output signal of $GL_0$ is pulled down. T2 is turned on by the Reset signal, so that the point Q of T3 is discharged; T4 is turned on by the Reset signal, and the electrical potential of the output signal of $GL_0$ is pulled down. Meanwhile, the output signal of $GL_1$ is input to Output n−1 of $SR_2$, the input signal of the Start of $SR_2$ (that is, Output n−1) pre-charges the point Q of T3 of $SR_2$ through T1 to make the voltage of the point Q be increased.

A fourth phase is as shown by D in FIG. 4 and FIG. 5, and is a half clock period after the third period. At this time, T3 in $SR_2$ is turned on, the capacitor C1 makes the electrical potential of T3 in $SR_2$ be increased, the $GL_2$ outputs the high level signal, and the output signal of $GL_2$ has been shifted as compared to the output signal of $GL_1$.

$SR_3, SR_4, \ldots, SR_n, SR_{n+1}$ repeat the above process, so the scanning from up to down is accomplished by the gate driving circuit, that is, the gate driving scanning output from up to down is accomplished under the control of the high/low levels of the Start (Output n−1)/Reset (Output n+1), CLKA/CLKB.

Polycrystalline silicon, amorphous silicon or oxide semiconductors may be used as material of semiconductor layer of the TFTs in the shift register unit of the embodiments of the present disclosure.

The gate driving circuit provided in the embodiments of the present disclosure has a simple structure, and the shift register unit in the gate driving circuit has a relative smaller number of TFTs, so the space for layout of the circuit can be effectively reduced and power consumption of the circuit can also be reduced. In addition, power consumption of the circuit is small since there is only one capacitor functioning as pulling up the electrical potential of the gate of the third TFT. In addition, with the aid of a structural unit being constituted by the fifth TFT and functioning as pulling down the electrical potential of the output terminal, the burrs and miscellaneous spikes in the gate driving square wave outputted by the circuit can be well suppressed.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register unit including an input terminal, an output terminal, a first clock signal input terminal, a second clock signal input terminal, a low potential connecting terminal and a reset terminal, the shift register unit further consisting of:
   a first Thin Film Transistor TFT having a first electrode connected to the input terminal and a gate connected to the second clock signal input terminal;
   a second TFT having a first electrode connected to the second electrode of the first TFT, a gate connected to the reset terminal, and a second electrode connected to the low potential connecting terminal;
   a third TFT having a second electrode connected to the output terminal, a first electrode connected to the first clock signal input terminal, and a gate connected to a second electrode of the first TFT;
   a fourth TFT having a first electrode connected to the output terminal, a gate connected to the reset terminal, and a second electrode connected to the low potential connecting terminal;
   a fifth TFT having a gate directly connected to the second clock signal input terminal, a first electrode directly connected to the output terminal, and a second electrode connected to the low potential connecting terminal; and
   a capacitor connected between the gate and the second electrode of the third TFT;
   wherein a first clock signal input from the first clock signal input terminal and a second clock signal input from the second clock signal input terminal have a same period and are inverted to each other.

2. The shift register unit of claim 1, wherein in the first TFT, the second TFT, the third TFT, the fourth TFT and the fifth TFT, the first electrode of any of t TFTs is drain and the second electrode thereof is source, and the first electrode of any of (5-t) TFTs is source and the second electrode thereof is drain, wherein t is an integer and 0≤t≤5.

3. The shift register unit of claim 1, wherein, all of the first TFT, the second TFT, the third TFT, the fourth TFT and the fifth TFT are N type Transistors.

4. The shift register unit of claim 1, wherein polycrystalline silicon, amorphous silicon or oxide semiconductors are used as material of semiconductor layer in the TFTs.

5. A gate driving circuit including n shift register units of claim 1, wherein:
   the input terminal of a first shift register unit is connected to a start signal input terminal;

the input terminal of an $m^{th}$ shift register unit is connected to the output terminal of an $(m-1)$th shift register unit, the reset terminal of the $m^{th}$ shift register unit is connected to the output terminal of an $(m+1)^{th}$ shift register unit, wherein both m and n are integers and $1<m<n$.

6. A display apparatus including the gate driving circuit of claim 5.

\* \* \* \* \*